(12) United States Patent
Khang et al.

(10) Patent No.: US 11,939,173 B2
(45) Date of Patent: Mar. 26, 2024

(54) TRANSPORTATION HEAD FOR MICROCHIP TRANSFER DEVICE, MICROCHIP TRANSFER DEVICE HAVING SAME, AND TRANSFER METHOD THEREBY

(71) Applicant: LG Display Co., Ltd., Seoul (KR)

(72) Inventors: Dahl-Young Khang, Paju-si (KR); Sung-Hwan Hwang, Paju-si (KR); Jia Lee, Paju-si (KR); Sung-Soo Yoon, Paju-si (KR); Su Seok Choi, Paju-si (KR); Kiseok Chang, Paju-si (KR); Jeong Min Moon, Paju-si (KR); Soon Shin Jung, Paju-si (KR); Sungpil Ryu, Paju-si (KR); Jihwan Jung, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 264 days.

(21) Appl. No.: 17/270,725

(22) PCT Filed: Aug. 23, 2019

(86) PCT No.: PCT/KR2019/010779
§ 371 (c)(1),
(2) Date: Feb. 23, 2021

(87) PCT Pub. No.: WO2020/040605
PCT Pub. Date: Feb. 27, 2020

(65) Prior Publication Data
US 2021/0339964 A1    Nov. 4, 2021

(30) Foreign Application Priority Data

Aug. 23, 2018  (KR) .......................... 10-2018-0098468

(51) Int. Cl.
*H01L 21/67* (2006.01)
*B65G 47/90* (2006.01)
*H01L 21/677* (2006.01)

(52) U.S. Cl.
CPC ........ *B65G 47/90* (2013.01); *H01L 21/67721* (2013.01)

(58) Field of Classification Search
CPC ..... B65G 47/90; B65G 2207/02; H01L 24/00; H01L 21/67144; H01L 21/67721; H01L 21/67742; H01L 21/67712; H01L 2224/75
See application file for complete search history.

(56) References Cited

U.S. PATENT DOCUMENTS

2019/0252350 A1* 8/2019 Schwarz ................. H01L 24/75

FOREIGN PATENT DOCUMENTS

| JP | 2008-177215 A | 7/2008 |
| JP | 5963374 B2 | 8/2016 |
| JP | 2016-157845 A | 9/2016 |

(Continued)

*Primary Examiner* — Ronald P Jarrett
(74) *Attorney, Agent, or Firm* — POLSINELLI PC

(57) ABSTRACT

A transportation head for a microchip transfer device capable of minimizing mechanical and chemical damage to a microchip, a microchip transfer device having same, and a transfer method thereby, and the transportation head includes a head body having a pickup area and a dummy area; a first protruding pin disposed in the pickup area of the head body; and a liquid droplet attached to the first protruding pin.

16 Claims, 9 Drawing Sheets

(56) References Cited

FOREIGN PATENT DOCUMENTS

| KR | 10-2012-0012225 A | 2/2012 | |
|---|---|---|---|
| KR | 10-1817703 B1 | 1/2018 | |
| KR | 101817703 * | 1/2018 | .......... B25J 11/0095 |

* cited by examiner (a)  (b)

(a)  (b)

TRANSPORTATION HEAD FOR MICROCHIP TRANSFER DEVICE, MICROCHIP TRANSFER DEVICE HAVING SAME, AND TRANSFER METHOD THEREBY

CROSS-REFERENCE TO RELATED APPLICATION

This application is a National Phase Entry of PCT International Application No. PCT/KR2019/010779 filed on Aug. 23, 2019, which claims priority to Korean Application No. 10-2018-0098468 filed on Aug. 23, 2018, which are hereby incorporated by reference in their entirety.

BACKGROUND

Field of the Disclosure

The present disclosure relates to a transportation head for a microchip transfer apparatus, a microchip transfer apparatus having the same, and a microchip transfer method using the same. More specifically, the present disclosure relates to a transportation head for a microchip transfer apparatus capable of minimizing mechanical and chemical damages to a microchip, a microchip transfer apparatus having the same, and a microchip transfer method using the same.

Description of the Background

A display having excellent characteristics such as thinness and flexibility has been developed in a field of display technology. Currently, major commercially available displays includes LCD (Liquid Crystal Display) and OLED (Organic Light Emitting Diode).

However, LCD has a problem that a response is not fast and it is difficult to implement a flexible LCD. OLED has a shorter lifespan, and a production yield thereof is poor and flexibility is poor.

Further, a light-emitting diode (LED) chip refers to a semiconductor light-emitting device that converts current into light. Starting with commercialization of a red LED using a GaAsP compound semiconductor, a GaP:N based green LED has been developed. Thus, LED has been used as a light source for displaying an image in electronic devices including information communication devices.

Recently, efforts to implement a flexible display using the light-emitting diode chip are in progress.

When producing the flexible display using the light-emitting diode chip, a larger number of light-emitting diode elements are grown on a wafer, and then are transported and transferred to locations corresponding to pixels on a display substrate.

A transportation method includes a method using a transportation head using an elastomer (PDMS) stamp scheme or a transportation head using an electrostatic scheme.

The transportation head using the elastomer (PDMS) stamp scheme controls an adhesive force by changing a speed of a print head for transportation. However, the transportation head using the elastomer (PDMS) stamp scheme has a possibility of wear due to reduction in adhesion of the stamp due to repeated uses thereof, and a possibility that the light-emitting diode chip may be damaged due to a pressure.

Further, in a conventional transportation head using the PDMS stamp scheme, it may be difficult to produce the transportation head itself. After the production of the transportation head, a function of the stamp may deteriorate due to repeated uses thereof.

On the other hand, the transportation head using the electrostatic scheme selectively applies an input voltage to generate a gripping force, and has a configuration that an electrode layer and a dielectric layer are disposed on a mesa structure.

However, in the transportation head using the electrostatic scheme, the dielectric layer may be damaged during repeated transportation processes, and the light-emitting diode chip may be damaged due to high voltage arcing.

Further, it may be difficult to produce the transportation head using the electrostatic scheme having a large area. In the transportation head using the electrostatic scheme, change in a charged potential due to static electricity depending on a surrounding environment may occur, and contamination of a surface of the light-emitting diode chip due to foreign substances may occur.

As described above, direct contact between the conventional transportation head using the electrostatic scheme and the light-emitting diode chip is inevitable. Thus, the damage and the contamination of the light-emitting diode chip may occur.

Further, when the conventional transportation head using the electrostatic scheme picks up the light-emitting diode chip, misalignment in which the light-emitting diode chip and the transportation head are not accurately aligned with each other may occur. Thus, self-alignment is not achieved, greatly increasing defects.

A purpose of the present disclosure is to provide a transportation head for a microchip transfer apparatus capable of minimizing mechanical and chemical damages to a microchip, a microchip transfer apparatus having the same, and a microchip transfer method using the same.

To this end, according to the present disclosure, the transportation head includes a head body having a pickup region and a dummy region, first protruding pins arranged on the pickup region of the head body, and a liquid droplet attached to the first protruding pins.

That is, the transportation head according to the present disclosure, only the first protruding pins disposed on the pickup region and a head body portion corresponding to the pickup region are selectively hydrophilized, and a head body portion corresponding to the dummy region is hydrophobized.

In particular, the head according to the present disclosure picks up, transports and transfers the microchip using a capillary force of the liquid droplet made of pure water ($H_2O$) at room temperature and atmospheric pressure.

As a result, the head according to the present disclosure uses only the liquid droplet made of pure water ($H_2O$) at room temperature and atmospheric pressure, so that there is no risk of mechanical and chemical damages of the microchip or contamination between the transportation head and the microchip during pickup, transportation and transfer.

Further, the head according to the present disclosure has a structural advantage in which the head is able to pick up the microchip without direct contact between the transportation head and the microchip, and is able to pick up the microchip without the damage thereof even when a roughness and a stiffness of the microchip are high.

Further, according to the present disclosure, even when misalignment occurs when picking up the microchip, correct alignment may be achieved based on a self-alignment effect after a certain period of time has elapsed due to a surface tension between the liquid droplet and the microchip, thereby significantly reducing the defects without performing a separate follow-up measure.

The transportation head for the microchip transfer apparatus according to the present disclosure includes a head body having a pickup region and a dummy region, at least one first protruding pins arranged on the pickup region of the head body, and a liquid droplet attached to the first protruding pin.

In this connection, only the first protruding pins disposed on the pickup region and a head body portion corresponding to the pickup region are hydrophilized, and a head body portion corresponding to the dummy region is hydrophobized.

As a result, when the transportation head for the microchip transfer apparatus according to the present disclosure performs the pick-up and transfer process of the microchip, the liquid droplet attached to the hydrophilized first protruding pin may contact the microchip. Thus, the transportation head according to the present disclosure may pick up the microchip using the capillary force generated between the liquid droplet and the microchip, and then transport and transfer the microchip to a substrate.

In this way, when the head according to the present disclosure performs the pick-up, transportation and transfer process of the microchip, only the liquid droplet made of pure water ($H_2O$) at room temperature and atmospheric pressure contacts the microchip, so that there is no risk of mechanical and chemical damages of the microchip or contamination between the transportation head and the microchip.

Further, the transportation head for the microchip transfer apparatus according to the present disclosure picks up the microchip using the liquid droplet attached to the first protruding pins arranged on the pickup region. Thus, even when misalignment occurs between the transportation head and the microchip during the pickup process, self-alignment may be achieved by the surface tension between the liquid droplet and the microchip.

Thus, even when misalignment occurs when picking up the microchip, correct alignment may be achieved based on a self-alignment effect after a certain period of time has elapsed due to a surface tension between the liquid droplet and the microchip, thereby significantly reducing the defects without performing a separate follow-up measure.

In the transportation head for the microchip transfer apparatus according to the present disclosure, only the first protruding pins disposed on the pickup region and a head body portion corresponding to the pickup region are hydrophilized, and the liquid droplet is attached to the hydrophilized first protruding pin.

When the transportation head for the microchip transfer apparatus according to the present disclosure performs the pick-up and transfer process of the microchip, the liquid droplet attached to the hydrophilized first protruding pin may contact the microchip. Thus, the transportation head according to the present disclosure may pick up the microchip using the capillary force generated between the liquid droplet and the microchip, and then transport and transfer the microchip to a substrate.

In this way, when the head according to the present disclosure performs the pick-up, transportation and transfer process of the microchip, only the liquid droplet made of pure water at room temperature and atmospheric pressure contacts the microchip, so that there is no risk of mechanical and chemical damages of the microchip or contamination between the transportation head and the microchip.

Further, the transportation head for the microchip transfer apparatus according to the present disclosure picks up the microchip using the liquid droplet attached to the first protruding pins arranged on the pickup region. Thus, even when misalignment occurs between the transportation head and the microchip during the pickup process, self-alignment may be achieved by the surface tension between the liquid droplet and the microchip.

Thus, even when misalignment occurs when picking up the microchip, correct alignment may be achieved based on a self-alignment effect after a certain period of time has elapsed due to a surface tension between the liquid droplet and the microchip, thereby significantly reducing the defects without performing a separate follow-up measure.

BRIEF DESCRIPTION OF THE DRAWINGS

The accompanying drawings, which are included to provide a further understanding of the disclosure and are incorporated in and constitute a part of the present disclosure, illustrate aspects and together with the description serve to explain the principles of the disclosure.

In the drawings.

DETAILED DESCRIPTIONS

Figure 1:
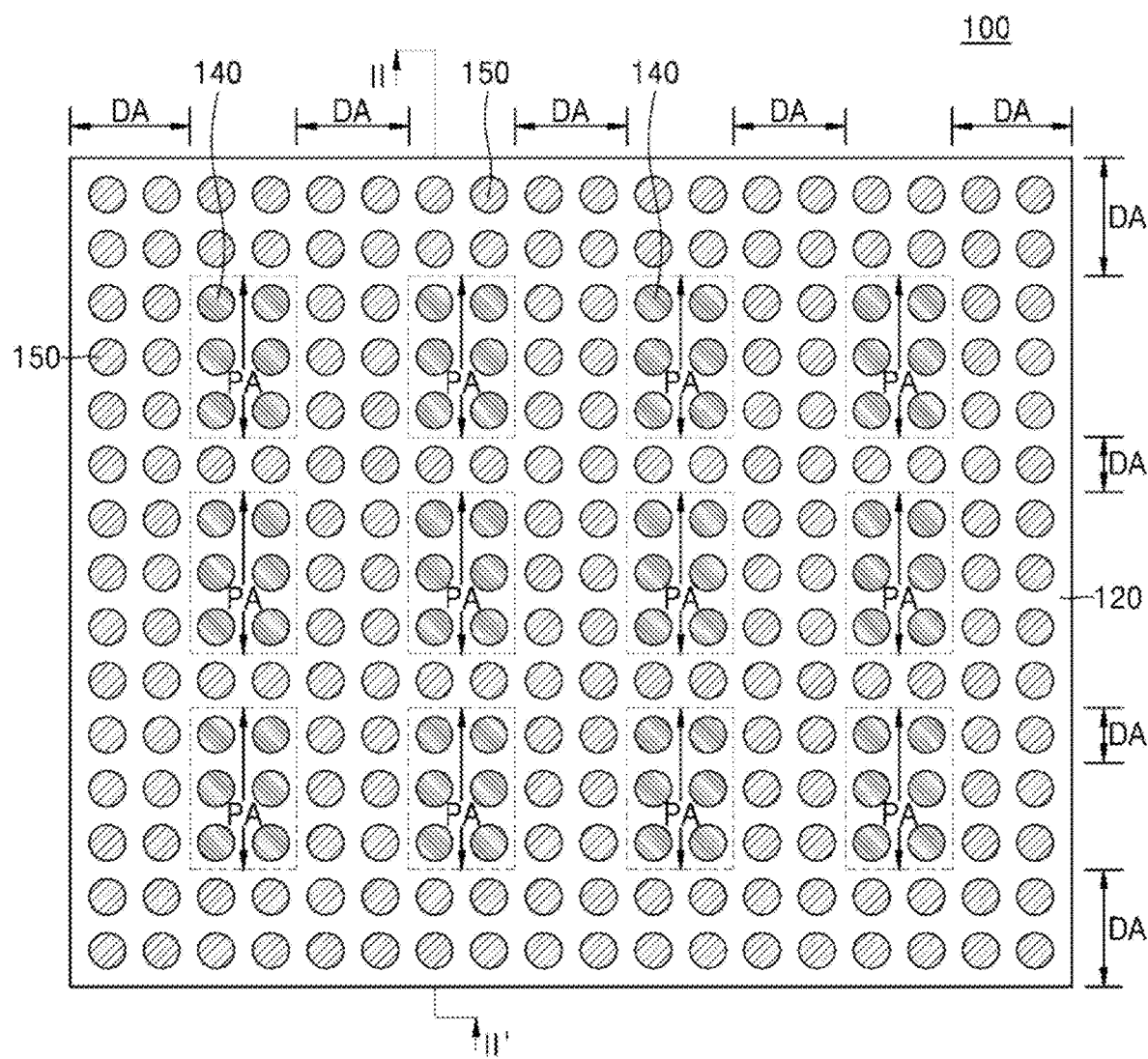
FIG. 1 is a top view showing a transportation head for a microchip transfer apparatus according to an aspect of the present disclosure.

The above features and advantages will be described in detail later with reference to the accompanying drawings. Accordingly, a person with ordinary knowledge in the technical field to which the present disclosure belongs will be able to easily implement the technical idea of the present disclosure. In describing the present disclosure, when it is determined that a detailed description of a known component related to the present disclosure may unnecessarily obscure gist the present disclosure, the detailed description is omitted. Hereinafter, various aspects according to the present disclosure will be described in detail with reference to the accompanying drawings. In the drawings, the same reference numerals are used to indicate the same or similar elements.

Hereinafter, a transportation head for a microchip transfer apparatus according to various aspects of the present disclosure, a microchip transfer apparatus having the same, and a microchip transfer method using the same will be described in detail with reference to the accompanying drawings.

Figure 2:
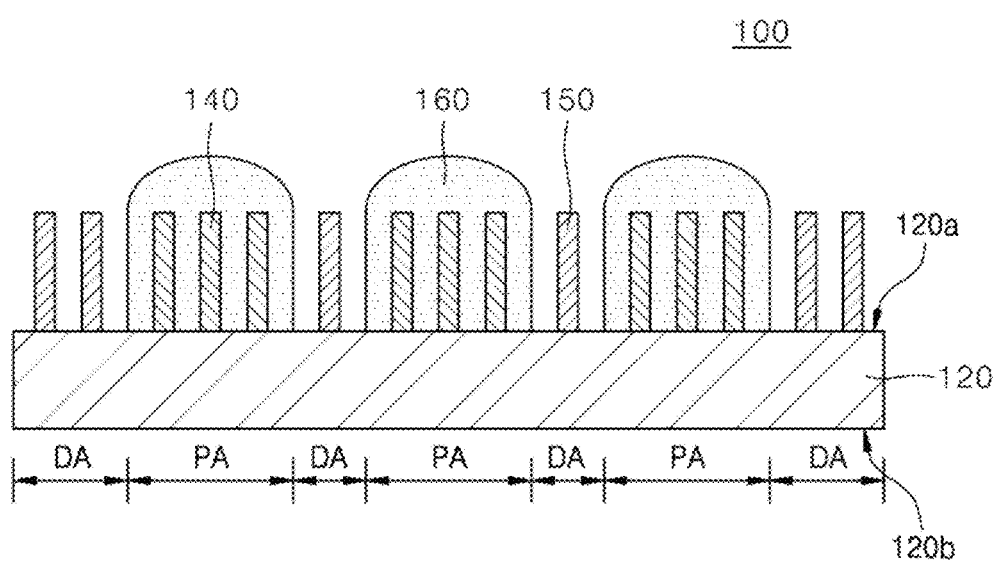
FIG. 2 is a cross-sectional view taken along line II-IF in FIG. 1.

FIG. 1 is a top view showing a transportation head for a microchip transfer apparatus according to an aspect of the present disclosure. FIG. 2 is a cross-sectional view cut along the line II-IF in FIG. 1. In this connection, FIG. 1 does not show a liquid droplet.

Referring to FIG. 1 and FIG. 2, a transportation head 100 for a microchip transfer apparatus according to an aspect of the present disclosure includes a head body 120, first protruding pins 140, second protruding pins 150, and liquid droplets 160.

The head body 120 has one face 120a and an opposite face 120b opposite to one face 120a. When viewed in a top view, the head body 120 may have a plate shape. However, the present disclosure is not limited thereto. The head body may have various shapes, such as a circle and a pentagon.

The head body 120 has a pickup region PA for picking up a microchip and a dummy region DA excluding the pickup region PA. In this connection, the pickup regions PAs are arranged and spaced apart from each other in a matrix form. The dummy region DA surrounds the pickup regions PAs.

FIG. 1 shows the transportation head 100 that has 12 pickup regions PAs and picks up 12 microchips at once using the 12 pickup regions PAs. However, this is an example and the number of the PAs may vary. As the number of the pickup regions PAs increases, the number of microchips that may be picked up increases. Therefore, for mass production, the larger the number of pickup regions PAs is, the more advantageous.

A material of the head body 120 may be one selected from silicon, glass, SUS (stainless steel), etc., but is not limited thereto. That is, the material of the head body 120 may not be particularly limited as long as the material is able to be photo-etched or laser-cut, and is capable of being selectively hydrophobized or hydrophilized.

In this connection, one face 120a of the head body 120 is oriented to face toward the microchip during a process of picking up the microchip. A position of each pickup region PA of the head body 120 corresponds to a position of each microchip.

An area of the pickup region PA may be the same as an area of the microchip, but is not limited thereto. That is, the area of the pickup region PA may be designed to be smaller or larger than the area of the microchip. Therefore, the area of the pickup region PA may have an area substantially similar to that of the microchip.

The first protruding pin 140 is disposed in the pickup region PA of the head body 120. The second protruding pin 150 is disposed in the dummy region DA of the head body 120. Each of the first and second protruding pins 140 and 150 may be formed by selectively and partially removing the head body 120 using a photolithography process or laser cutting.

In this connection, the first and second protruding pins 140 and 150 protrude from one face 120a of the head body 120. Each of the first and second protruding pins 140 and 150 may be designed as a separate structure made of a different material from that of the head body 120. However, in consideration of durability, each of the first and second protruding pins 140 and 150 may be designed as an integral structure made of the same material as that of the head body 120.

In other words, each of the first and second protruding pins 140 and 150 may protrude integrally from one face 120a of the head body 120, and a plurality of the first and second protruding pins 140 and 150 are arranged and are spaced apart in a matrix form.

In particular, the first protruding pins 140 arranged in the pickup region PA serves to hold the liquid droplet 160 thereon. To this end, the first protruding pins 140 may be arranged such that at least two thereof are spaced apart at a regular interval in order to increase a contact area thereof with the liquid droplet 160. As described above, as the number of the first protruding pins 140 increases, the contact area thereof with the liquid droplet 160 increases due to an expanded specific surface area of the first protruding pins 140. This may strengthen a bonding force between the first protruding pins 140 and the liquid droplet 160.

Therefore, adjacent two of the plurality of first protruding pins 140 is spaced apart from each other by a spacing 10 µm. Each of the plurality of first protruding pins 140 may have a diameter of 1 to 10 µm. In this connection, the plurality of second protruding pins 150 may be formed using the same photolithography or laser etching process as in the plurality of first protruding pins 140, and thus may be spaced from each other by substantially the same spacing as that between the plurality of first protruding pins 140, and each second protruding pin 150 may have a diameter as that of each of the plurality of first protruding pins 140.

When the spacing between adjacent two of the plurality of first protruding pins 140 is smaller than 1 µm, or the diameter of each of the plurality of first protruding pins 140 is smaller than 1 µm, it may be difficult to implement a fine pitch between the pins during the photolithography or laser cutting, which may lead to difficulty in spacing and diameter control. Conversely, when the spacing between adjacent two of the plurality of first protruding pins 140 exceeds 10 µm, or the diameter of each of the plurality of first protruding pins 140 exceeds 10 µm, the number of first protruding pins 140 in the pickup region PA is inevitably reduced, such that the liquid droplet 160 may not be properly attached to the first protruding pins 140 due to a decrease in the contact area thereof with the liquid droplet 160.

In particular, each of the plurality of first protruding pins 140 may have a height of 10 to 50 µm. In this connection, the plurality of second protruding pins 150 may be formed using the same photolithography process or laser cutting process as in the plurality of first protruding pins 140, and thus each second protruding pin 150 may have substantially the same height as that of each of the plurality of first protruding pins 140.

When the height of each of the plurality of first protruding pins 140 is smaller than 10 µm, reduction in the specific surface area of the first protruding pins 140 in the pickup region PA may cause difficulty in adhesion of the liquid droplet 160 thereto. Conversely, when the height of each of the plurality of first protruding pins 140 exceeds 50 there is a concern that the etching or cutting may not be performed at a uniform width during the photo etching or the laser cutting. When the plurality of first protruding pins 140 contact each other due to over-etching or over-cutting, there is a concern that the contact area thereof with the liquid droplet 160 may be reduced.

In this connection, the first protruding pins 140 arranged in the pickup region PA and a portion of the head body 120 corresponding thereto may be hydrophilized, while the second protruding pin 150 arranged in the dummy region DA and a portion of the head body 120 corresponding thereto are hydrophobized.

Accordingly, in the transportation head 100 according to the present disclosure, the first protruding pins 140 arranged in the pickup region PA and a portion of the head body 120 corresponding thereto are selectively hydrophilized, while the second protruding pin 150 arranged in the dummy region DA and a portion of the head body 120 corresponding thereto are hydrophobized.

To this end, both of the pickup region PA and the dummy region DA of the transportation head 100 according to the present disclosure may be first subjected to hydrophobization treatment and then only the hydrophobized pickup region PA may be selectively hydrophilized.

Alternatively, the dummy region DA of the transportation head 100 according to the present disclosure may be first and selectively hydrophobized and the pickup region PA thereof may then be selectively hydrophilized.

Alternatively, both of the pickup region PA and the dummy region DA of the transportation head 100 according to the present disclosure may be first subjected to hydrophilization treatment and then only the hydrophilized dummy region DA may be selectively hydrophobized.

In this connection, the hydrophobization treatment may include coating a fluoropolymer. The hydrophilization may be performed using $O_2$ plasma treatment or by depositing an oxide film.

The liquid droplet 160 is attached to the first protruding pin 140. These liquid droplets 160 may be attached to the pickup regions PAs in one-to-one manner. However, the preset disclosure is not limited thereto. In this connection, in the transportation head 100 according to the present disclosure, the first protruding pins 140 arranged in the pickup region PA and a portion of the head body 120 corresponding thereto are selectively hydrophilized, such that these liquid droplets 160 may be attached to the first protruding pins 140 arranged in the pickup region PA and the portion of the head body 120 corresponding thereto.

These liquid droplets 160 may be selectively formed only in the hydrophilized pickup region PA by dipping the transportation head 100 in a liquid-filled reaction vessel.

Alternatively, the liquid droplets 160 may be formed using a vapor evaporation condensation scheme in a state where the transportation head 100 is mounted on a top of the reaction vessel filled with liquid. That is, the liquid droplet 160 may be selectively formed only in the hydrophilized pickup region PA by heating the reaction vessel to evaporate the liquid to generate water vapor and rapidly cooling the water vapor. Alternatively, the liquid droplets 160 may be formed in a fine droplet form using an ultrasonic humidifier.

The liquid droplet 160 may have a rectangular shape when viewed in a top view. However, the present disclosure is not limited thereto. That is, a shape of the liquid droplet 160 is not particularly limited as long as the shape may expand the surface area to maximize the surface tension. Therefore, each of the liquid droplets 160 may have various shapes such as a rectangle, a star shape, a pentagonal shape, and a hexagonal shape when viewed in a top view. In this case, that the pickup region PA may have substantially the same shape as that of the liquid droplet 160.

Water ($H_2O$) may be used as a material of the liquid droplet 160. However, the disclosure is not limited thereto. Any material for the liquid droplet 160 may be used without particular limitation as long as the liquid does not evaporate well after a certain period of time has elapsed in a room temperature and atmospheric pressure environment. That is, the liquid droplet 160 may be made only of pure water, or of water containing various additives added thereto as needed.

Therefore, in the transportation head 100 according to the present disclosure, the first protruding pins 140 arranged in the pickup region PA and a portion of the head body 120 corresponding thereto are selectively hydrophilized, such that these liquid droplets 160 may be attached to the first protruding pins 140 arranged in the pickup region PA and the portion of the head body 120 corresponding thereto.

As a result, when the transportation head 100 for the microchip transfer apparatus according to the aspect of the present disclosure performs the microchip pickup and transfer process, the liquid droplets 160 attached to the hydrophilized first protruding pins 140 may contact the microchip. Accordingly, the transportation head 100 according to the present disclosure may pick up the microchip using the capillary force generated between the liquid droplet 160 and the microchip, and then transport and transfer the microchip to the substrate.

In this way, when the head 100 according to the present disclosure performs the pick-up, transportation and transfer process of the microchip, only the liquid droplet 160 made of pure water ($H_2O$) at room temperature and atmospheric pressure contacts the microchip, so that there is no risk of mechanical and chemical damages of the microchip or contamination between the transportation head and the microchip.

Further, the transportation head 100 for the microchip transfer apparatus according to the present disclosure picks up the microchip using the liquid droplet 160 attached to the first protruding pins arranged on the pickup region PA. Thus, even when misalignment occurs between the transportation head 100 and the microchip during the pickup process, self-alignment may be achieved by the surface tension between the liquid droplet 160 and the microchip.

Thus, even when misalignment occurs when the transportation head 100 for the microchip transfer apparatus according to the present disclosure picks up the microchip, correct alignment may be achieved based on a self-alignment effect after a certain period of time has elapsed due to a surface tension between the liquid droplet 160 and the microchip, thereby significantly reducing the defects without performing a separate follow-up measure.

Figure 3:
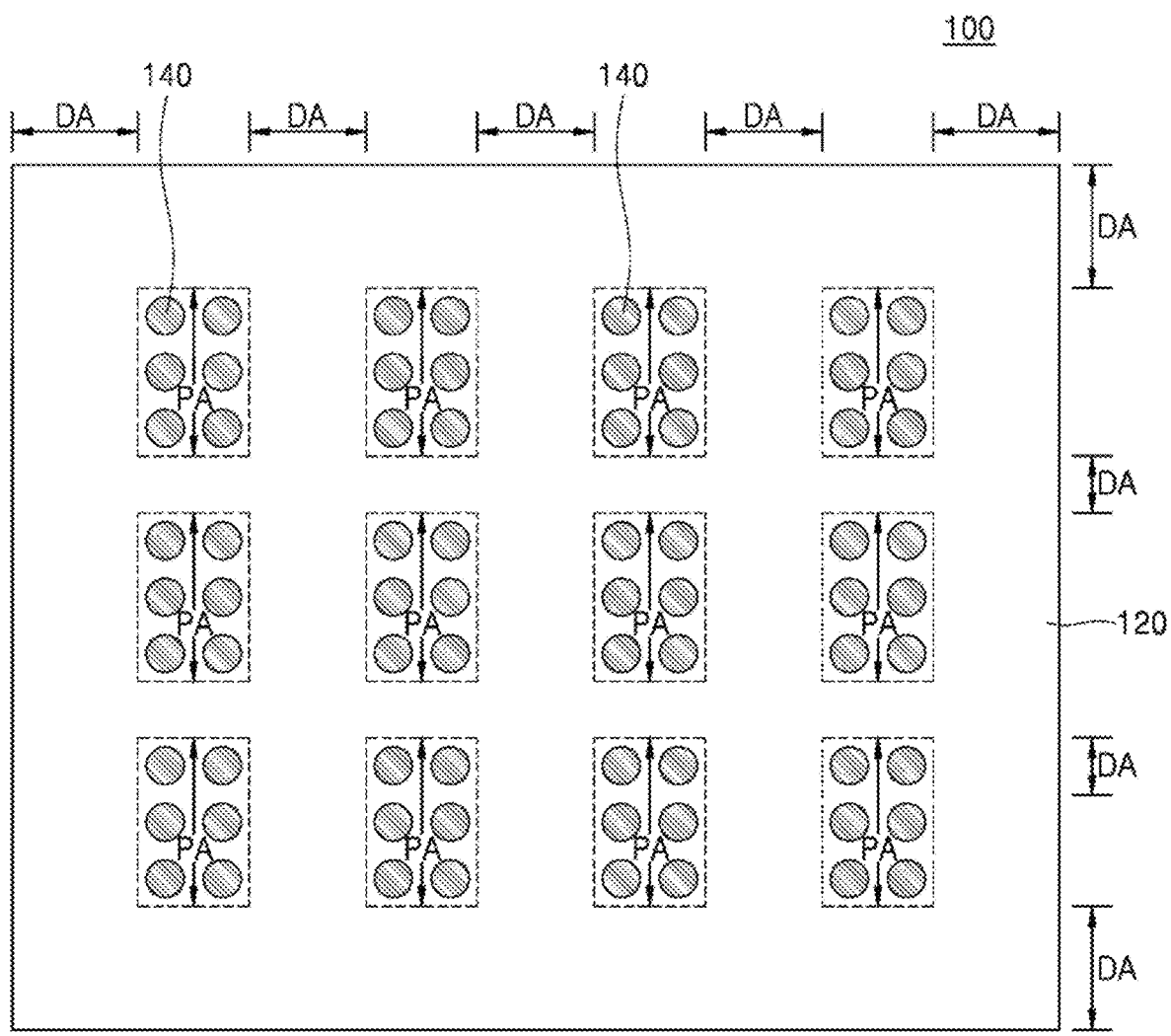
FIG. 3 is a top view showing a transportation head for a microchip transfer apparatus according to one variation of the present disclosure.

In one example, FIG. 3 is a top view showing a transportation head for a microchip transfer apparatus according to a variation of the present disclosure.

As shown in FIG. 3, a transportation head 100 for a microchip transfer apparatus according to a modified aspect of the present disclosure has substantially the same configuration as that of the transportation head for the microchip transfer apparatus according to the aspect as shown and described in FIG. 2.

However, in the transportation head 100 for a microchip transfer apparatus according to the modification of the present disclosure as shown in FIG. 3, only the first protruding pins 140 are arranged in the pickup region PA of the head body 120, and the second protruding pins 150 in FIG. 2 are not present in the dummy region DA of the head body 120.

In this connection, the first protruding pins 140 arranged in the pickup region PA and a portion of the head body 120 corresponding thereto may be selectively hydrophilized. A portion of the head body 120 corresponding to the dummy region DA may be hydrophobized.

In the transportation head 100 for a microchip transfer apparatus according to the modification of the present disclosure as described above with reference to FIG. 3, the second protruding pin is not formed in the hydrophobized dummy region DA, such that a structure of the head may be simplified.

Further, even when misalignment occurs while the transportation head 100 for a microchip transfer apparatus according to the modification of the present disclosure as described above with reference to FIG. 3 performs the microchip pickup process, there is no risk of a defect otherwise occurring when the microchip is in contact with the head body 120 of the dummy region DA. This is due to a structure in which the second protruding pin is not formed in the dummy region DA.

Figure 4:
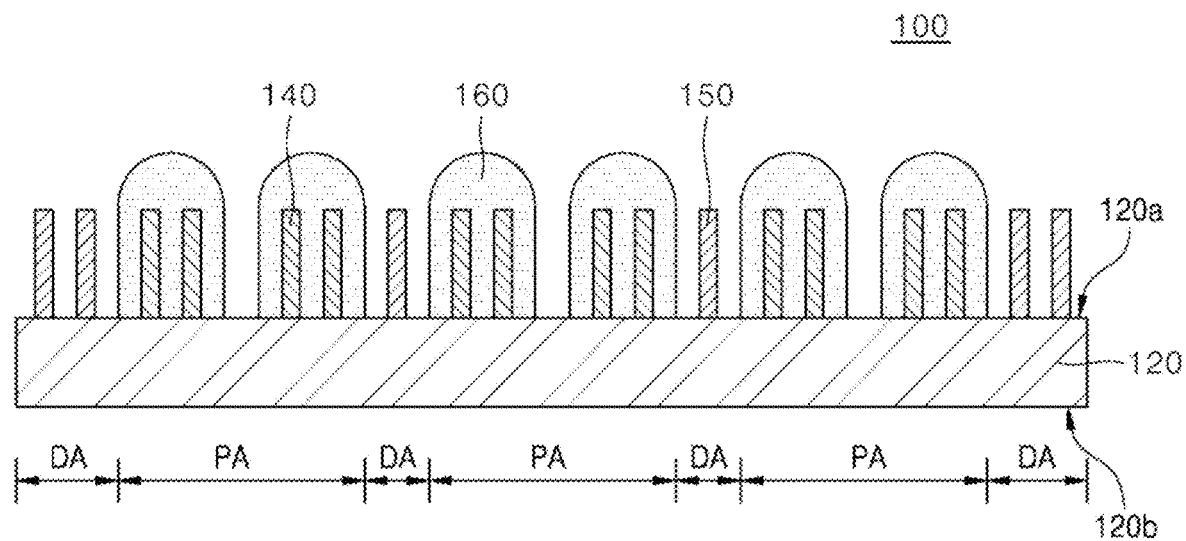
FIG. 4 is a cross-sectional view showing a transportation head for a microchip transfer apparatus according to another variation of the present disclosure.

In one example, FIG. 4 is a cross-sectional view showing a transportation head for a microchip transfer apparatus according to another modification of the present disclosure.

As shown in FIG. 4, a transportation head 100 for a microchip transfer apparatus according to another modification of the present disclosure has substantially the same configuration as that of the transportation head for a microchip transfer apparatus according to the aspect shown and described in FIG. 2.

However, the transportation head 100 for a microchip transfer apparatus according to another modification of the present disclosure has a structure in which at least two liquid droplets 160 are disposed in a single pickup region PA of the head body 120.

To this end, the plurality of first protruding pins 140 arranged in a single pickup region PA may be arranged such that a spacing between the first protruding pins 140 corresponding to each of at least two liquid droplets 160 is smaller than a spacing between groups of the first protruding pins 140 corresponding to at least two liquid droplets 160, respectively. Therefore, the spacing between groups of the first protruding pins 140 corresponding to at least two liquid droplets 160, respectively in a single PA may be 8 to 15 μm.

Thus, in the transportation head 100 for a microchip transfer apparatus according to another modification of the present disclosure, the at least two liquid droplets 160 are disposed in the pickup region PA of the head body 120. Thus, the head 100 may pick up the microchip more reliably due to increase in the number of contact points therebetween.

Figure 5:
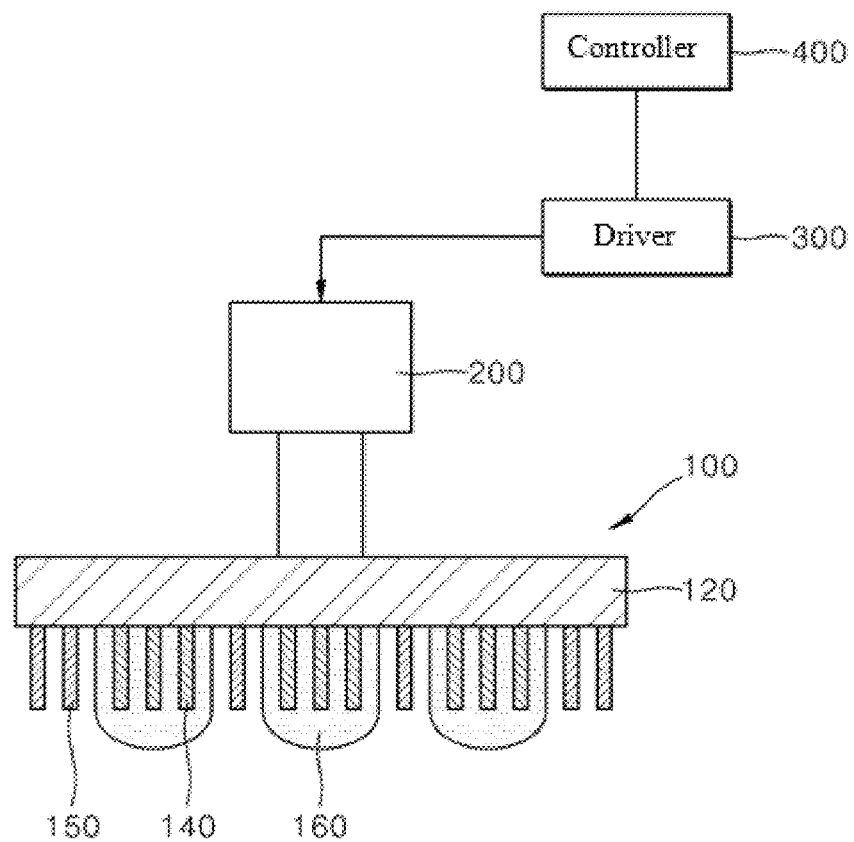
FIG. 5 is a cross-sectional view showing a microchip transfer apparatus according to an aspect of the present disclosure.

In one example, FIG. 5 is a cross-sectional view showing a microchip transfer apparatus according to an aspect of the present disclosure.

Referring to FIG. 5, a microchip transfer apparatus 1000 according to an aspect of the present disclosure includes the transportation head 100, a transportation arm 200, a driver 300, and a controller 400.

The transportation head 100 includes the head body 120 having the pickup region and the dummy region, the first protruding pins 140 arranged on the pickup region of the head body 120, and a liquid droplet 160 attached to the first protruding pins 140.

In this connection, the first protruding pins 140 arranged in the pickup region and a portion of the head body 120 corresponding to the pickup region are hydrophilized, while a portion of the head body 120 corresponding to the dummy region is hydrophobized.

Alternatively, the transportation head 100 may further include the second protruding pins 150 arranged disposed in the dummy region of the head body 120, and hydrophobized together with the portion of the head body 120 corresponding to the dummy region.

The transportation arm 200 is coupled to the transportation head 100.

The driver 300 drives the transportation arm 200 to move the transportation head 100 coupled to the transportation arm 200.

The controller 400 controls the driver 300 to control a position to which the transportation head 100 coupled to the transportation arm 200 moves. Accordingly, the transportation head 100 coupled to the transportation arm 200 performs horizontal and vertical reciprocating motions under the operation of the driver 300 controlled by the controller 400.

Figure 6:
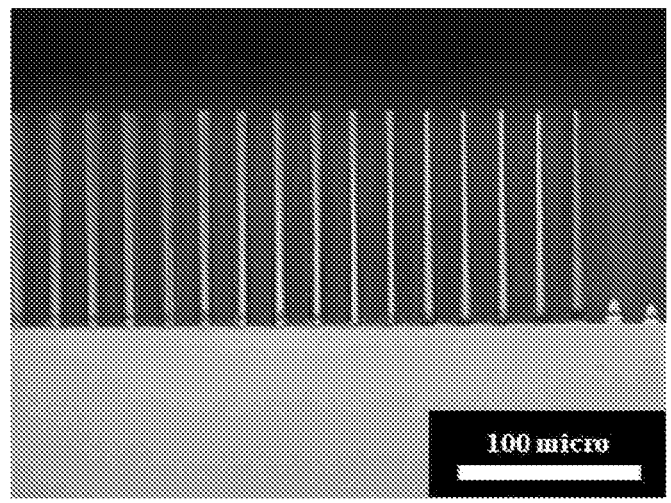
FIG. 6 is a photograph showing a cross-sectional view of the transportation head according to the present disclosure.
Figure 7:
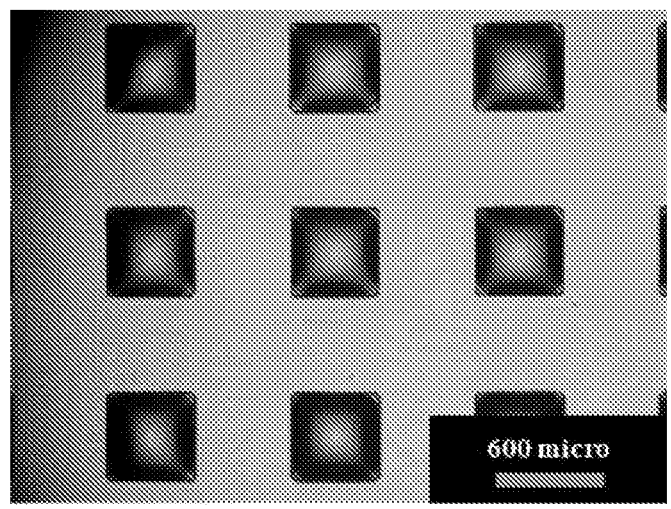
FIG. 7 and FIG. 8 are photographs showing the top views of the transportation head according to the present disclosure.
Figure 8:
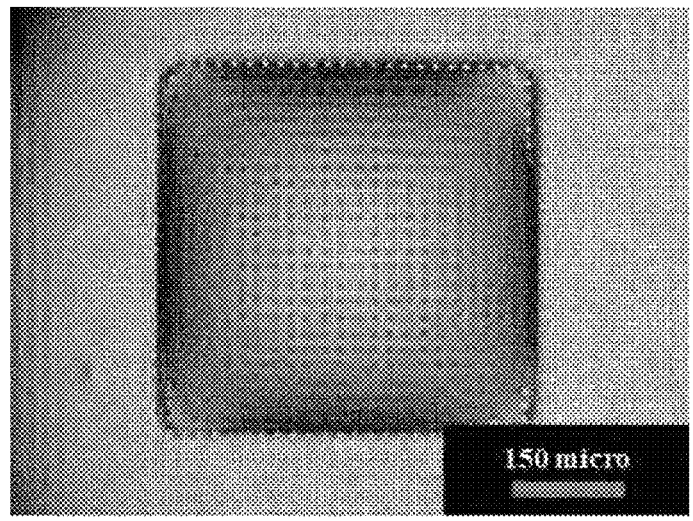

In one example, FIG. 6 is an actual cross-sectional photograph showing the transportation head according to the present disclosure. FIG. 7 and FIG. 8 are actual top photographs showing the transportation head according to the present disclosure.

As shown in FIG. 6, the head is designed in a structure in which the first and second protruding pins protrude integrally from one face of the transportation head. The transportation head body and the first and second protruding pins are made of silicon (Si).

As shown in FIG. 7 and FIG. 8, it may be seen that liquid droplets are selectively attached only to the hydrophilized first protruding pins and the hydrophilized portion of the head body in the pickup region.

Hereinafter, a microchip transfer method according to an aspect of the present disclosure will be described with reference to the accompanying drawings.

Figure 9:
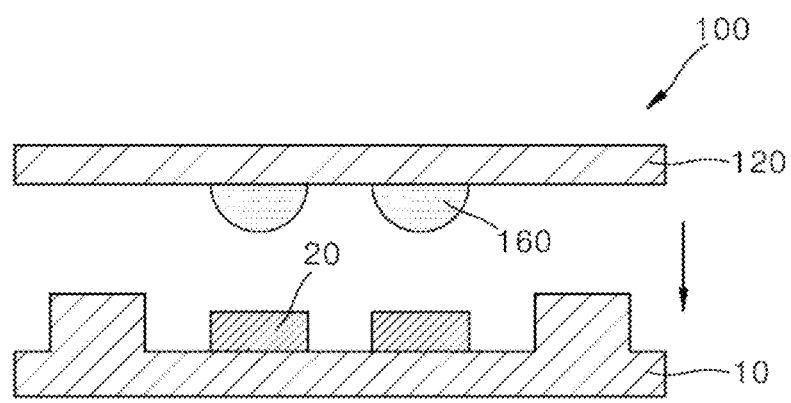
FIG. 9 to FIG. 11 are cross-sectional views showing a process of a microchip transfer method according to an aspect of the present disclosure.
Figure 10:
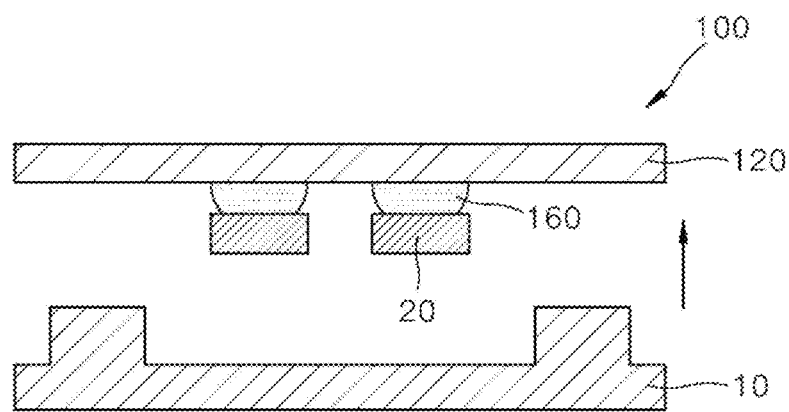
Figure 11:
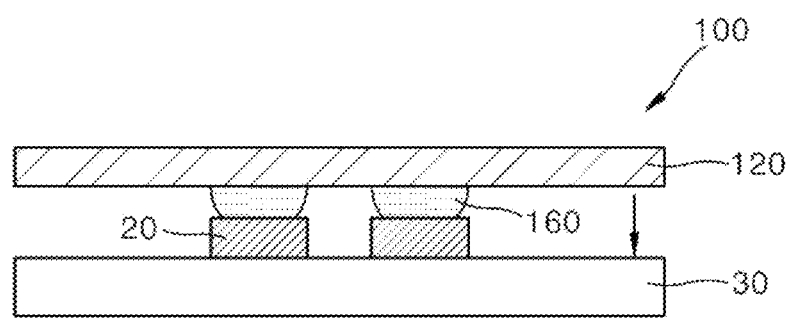

FIG. 9 to FIG. 11 are process cross-sectional views showing a microchip transfer method according to an aspect of the present disclosure.

As shown in FIG. 9, the method may align the transportation head 100 having the liquid droplet 160 attached thereto with a top of the chip support 10 accommodating thereon the microchip 20.

In this connection, the microchip 20 may be one selected from a light-emitting diode chip, a semiconductor chip, and a bio chip, but is not limited thereto.

The chip support 10 may be a tray or a wafer to accommodate the microchip 20 thereon.

In this connection, the transportation head 100, as shown in FIG. 2 may include the head body 120 having the pickup region PA and the dummy region DA, the first protruding pins 140 arranged on the pickup region PA of the head body 120, and the liquid droplets 160 attached to the first protruding pins 140. In this connection, the first protruding pins 140 and the portion of the head body 120 in the pickup region PA are hydrophilized, while the portion of the head body 120 in the dummy region DA is hydrophobized.

Next, as shown in FIG. 10, the liquid droplet 160 attached to the transportation head body 120 is brought into contact with the microchip 20 mounted on the chip support 10 such that the head 100 picks up the microchip 20 from the chip support 10.

In this connection, when the transportation head 100 is lowered toward the chip support 10 such that the liquid droplet 160 attached to the transportation head body 120 comes into contact with the microchip 20, the capillary force between liquid droplet 160 and the microchip 20 causes the microchip 20 to adhere to the liquid droplet 160.

Thereafter, the transportation head 100 is raised up and the microchip 20 attached to the liquid droplet 160 is picked up and is removed from the chip support 10.

In this connection, according to the present disclosure, in the process of picking up the microchip 20, the liquid droplet 160 made of pure water at room temperature and atmospheric pressure comes into contact with the microchip 20. Thus, there is no risk of contamination of or damage to the microchip 20.

Further, in accordance with the present disclosure, the microchip 20 may be picked up using the liquid droplet 160 attached to the first protruding pins 140 arranged on the pickup region. Thus, even when misalignment occurs between the transportation head 100 and the microchip 20 during the pickup process, self-alignment may be achieved due to the surface tension between the liquid droplet 160 and the microchip 20.

Next, as shown in FIG. 11, the microchip 20 picked up using the liquid droplet 160 of the transportation head 100 is attached to the substrate 30 and transferred thereto.

That is, the microchip 20 picked up using the liquid droplet 160 of the transportation head 100 is transported to a top of the substrate 30, and then the transportation head 100 is lowered such that the microchip 20 is attached to the substrate 30 and transferred thereto.

In this step, an adhesive layer may be disposed on a bottom face of the microchip 20. Accordingly, when the transportation head 100 is raised while a constant pressure is applied to the microchip 20, the microchip 20 may be attached to the substrate 30 via the adhesive layer disposed on the bottom surface of the microchip 20. As a result, the liquid droplet 160 attached to the transportation head 100 may be separated from the microchip 20.

The transportation head alignment step, the pickup step, and the transfer step as described with reference to FIG. 9 to FIG. 11 are repeated at least once. In this connection, in the process of repeating the transportation head alignment step, the pickup step, and the transfer step in a room temperature and atmospheric pressure environment, a portion of the liquid droplet 160 may vaporize and thus an amount of the liquid droplet 160 may decrease. Only in this case, it is advisable to perform an additional step of replenishing the liquid droplet 160.

When the liquid droplet 160 attached to the first protruding pins 140 of the head body 120 is partially vaporized due to prolonged use, the amount of the liquid droplet 160 decreases and the surface tension thereof with the microchip 20 decreases, such that the self-alignment may not be achieved in a reliable manner. In this case, the self-alignment may be achieved by performing a post-treatment to replenish the liquid droplet 160 by dipping the transportation head 100 for the microchip transfer apparatus into a liquid-filled reaction vessel.

Alternatively, the self-alignment may be achieved by performing a post-treatment to replenish the liquid droplet 160 using a vapor evaporation condensation scheme in a state where the transportation head 100 is mounted on a top of the reaction vessel filled with liquid.

This post-treatment will be described in more detail below with reference to the accompanying drawings.

Figure 12A:
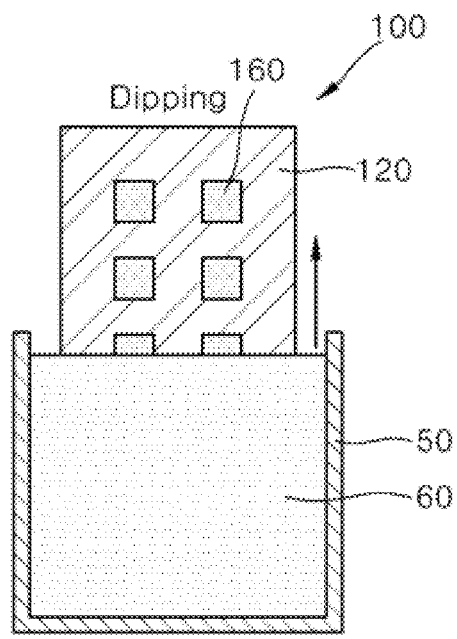
FIG. 12(a) and FIG. 12(b) are schematic diagrams for describing a process of replenishing liquid droplets attaching to the transportation head.
Figure 12B:
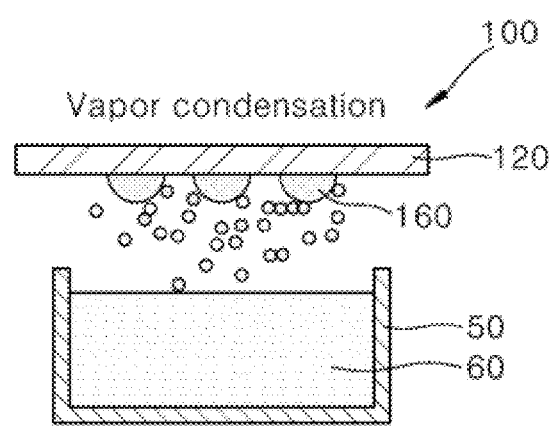

FIG. 12(*a*) and FIG. 12(*b*) are schematic diagrams describing a process of replenishing liquid droplets attached to the transportation head. More particularly, FIG. 12(*a*) shows a dipping scheme and FIG. 12(*b*) shows a vapor evaporation condensation scheme.

As shown in FIG. 12(*a*), the liquid droplet 160 may be replenished by immersing the transportation head in the reaction vessel 50 filled with liquid 60 in the dipping scheme.

Further, as shown in FIG. 12(*b*), the post-treatment to replenish the liquid droplet 160 may be performed using the vapor evaporation condensation scheme in which in a state where the transportation head 100 is mounted on the top of the reaction vessel 50 filled with liquid 60, the reaction vessel 50 is heated to evaporate the liquid to generate water vapor and the water vapor is rapidly cooled down.

Figure 13:
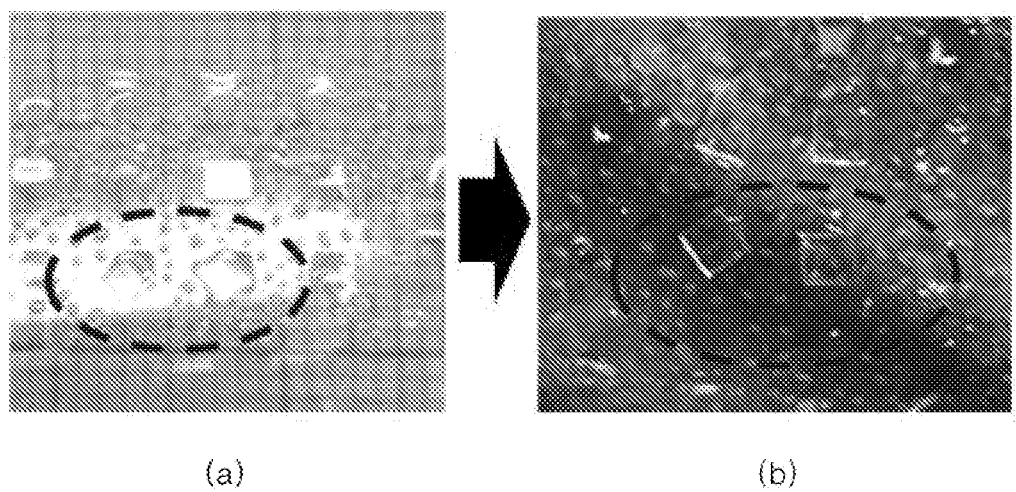
FIG. 13(a) and FIG. 13(b) are photographs showing that a PET chip is picked up using a glass-material based transportation head free of first and second protruding pins.

In one example, FIG. 13(*a*) and FIG. 13(*b*) are photographs showing that a PET chip is picked up using a glass-material based transportation head free of the first and second protruding pins. More particularly, FIG. 13(*a*) is an OM picture taken immediately after the pickup, and FIG. 13(*b*) is an OM picture taken 10 minutes after the pickup.

As shown in FIG. 13(*a*), the first and second protruding pins are not formed, and the pickup region is selectively hydrophilized. The picture shows a state immediately after the PET chip is picked up using the transportation head having liquid droplets attached to the pickup region. In this connection, it may be seen that the PET chip is partially misaligned and locations thereof are incorrect.

Thereafter, as shown in FIG. 13(*b*), it may be confirmed that when using the transportation head made of glass and free of the first and second protruding pins, the misalignment state may be maintained even after a certain period of time has elapsed.

Figure 14:
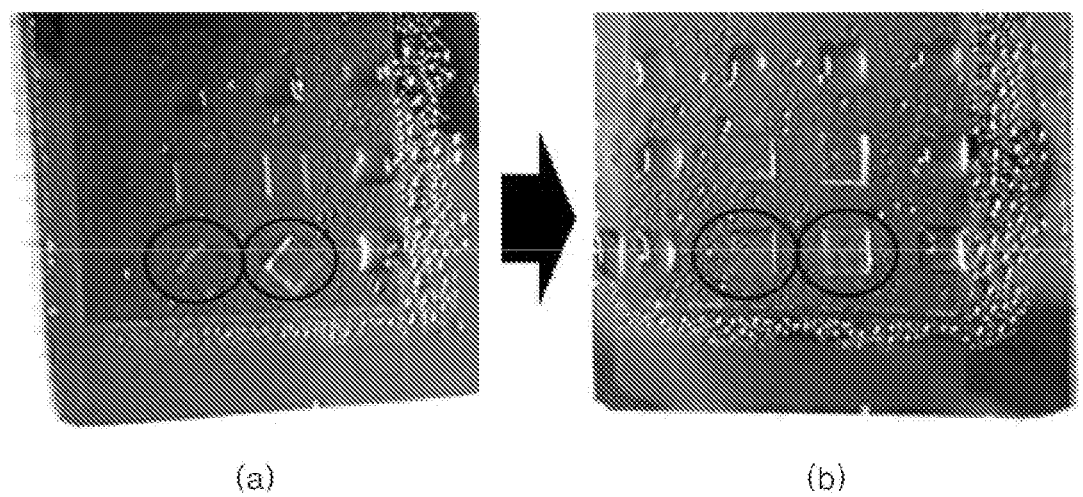
FIG. 14(a) and FIG. 14(b) are photographs showing that a PET chip is picked up using a transportation head made of silicon on which the first and second protruding pins are formed.

On the other hand, FIGS. 14(*a*) and 14(*b*) are photographs showing a state in which a PET chip is picked up using a transportation head made of silicon on which the first and second protruding pins are formed. More particularly, FIG. 14(*a*) is an OM picture taken immediately after the pickup, and FIG. 14(*b*) is an OM picture taken 10 minutes after the pickup.

As shown in FIG. 14(*a*), the first and second protruding pins are formed, and the pickup region is selectively hydrophilized. The photograph shows a state immediately after the PET chip is picked up using the transportation head having the liquid droplets attached to the pickup region. In this connection, partial misalignment of the PET chip occurs.

Thereafter, as shown in FIG. 14(*b*), it may be seen that when using the transportation head made of silicon and having the first and second protruding pins formed thereon, the self-alignment has been achieved after a certain period of time has elapsed.

Based on the above results, it was identified that when the first protruding pins are arranged on the pickup region, and even when misalignment occurs during the pickup of the microchip, the self-alignment occurs after a certain period of time due to the surface tension between the liquid droplet and the microchip, such that the defects may be greatly reduced without performing a separate follow-up measure.

As discussed above, each of the transportation head for a microchip transfer apparatus according to an aspect of the present disclosure, the microchip transfer apparatus having the same, and the microchip transfer method using the same picks up, transports and transfers the microchips using the capillary force of the liquid droplets made of pure water ($H_2O$) at room temperature and atmospheric pressure.

As a result, each of the transportation head for a microchip transfer apparatus according to an aspect of the present disclosure, the microchip transfer apparatus having the same, and the microchip transfer method using the same picks up the microchip using only the liquid droplets made of pure water ($H_2O$) at room temperature and atmospheric pressure, such that there is no risk of mechanical and chemical damages of the microchip or contamination between the transportation head and the microchip during the pickup, transportation and transfer.

Further, each of the transportation head for a microchip transfer apparatus according to an aspect of the present disclosure, the microchip transfer apparatus having the same, and the microchip transfer method using the same picks up the microchip without direct contact between the transportation head and the microchip. Further, even when the roughness and the stiffness of the microchip are higher, the head may pick up the microchip without damage thereto.

Further, using each of the transportation head for a microchip transfer apparatus according to an aspect of the present disclosure, the microchip transfer apparatus having the same, and the microchip transfer method using the same picks up the microchip, even when misalignment occurs while picking up the microchip, correct alignment may be achieved based on the self-alignment effect after a certain period of time has elapsed due to the surface tension between the liquid droplet and the microchip. Therefore, the defects may be significantly reduced without performing a separate follow-up measure.

In the above descriptions, the present disclosure has been mainly described based on the aspects. However, various changes or modifications may be made thereto at the level of a person skilled in the art. Therefore, as long as these changes and modifications do not depart from the scope of the present disclosure, those may be understood as being included within the scope of the present disclosure.

What is claimed is:

1. A transportation head for a microchip transfer apparatus, comprising:
    a head body having a plurality of pickup regions and a plurality of dummy regions being non-pickup regions and each pickup region disposed between two dummy regions;
    a plurality of first protruding pins disposed in each pickup region of the head body;
    one or more second protruding pins disposed to be spaced apart from each other in each dummy region of the head body; and
    a liquid droplet attached to the plurality of first protruding pins,
    wherein the liquid droplet is not attached to the one or more second protruding pins, and
    wherein the plurality of first protruding pins arranged to be spaced apart from each other in a first direction and a second direction intersecting the first direction in a matrix form in each pickup region of the head body, and
    wherein the one or more second protruding pins have a same height as each of the plurality of first protruding pins.

2. The transportation head of claim 1, wherein the plurality of first protruding pins and a first portion of the head body in the plurality of pickup regions are hydrophilized and a second portion of the head body in the plurality of dummy regions is hydrophobized by coating the fluoropolymer on the one or more second protruding pins.

3. The transportation head of claim 1, wherein a location of the plurality of pickup regions corresponds to a location of the microchip.

4. The transportation head of claim 1, wherein the plurality of pickup regions has an area corresponding to an area of the microchip.

5. The transportation head of claim 1, wherein the plurality of first protruding pins protrudes from one face of the head body and is integrated with the head body.

6. The transportation head of claim 1, wherein the plurality of second protruding pins and a portion of the head body in the dummy region are hydrophobized.

7. The transportation head of claim 1, wherein the plurality of first protruding pins are spaced apart from each other by a spacing of 1 to 10 µm.

8. The transportation head of claim 1, wherein each of the plurality of first protruding pins has a diameter of 1 to 10 µm.

9. The transportation head of claim 1, wherein each of the plurality of first protruding pins has a height of 10 to 50 µm.

10. The transportation head of claim 1, wherein the liquid droplet includes at least one droplet disposed in a single pickup region.

11. A microchip transfer apparatus comprising:
    a transportation head;
    a transportation arm coupled to the transportation head;
    a driver that drives the transportation arm to move the transportation head coupled to the transportation arm; and
    a controller configured to control the driver to control a position to which the transportation head coupled to the transportation arm moves,
    wherein the transportation head includes:
    a head body having a plurality of pickup regions and a plurality of dummy regions being non-pickup regions and each pickup region disposed between two dummy regions;
    a plurality of first protruding pins disposed in each pickup region of the head body;
    one or more second protruding pins disposed to be spaced apart from each other in each dummy region of the head body; and
    a liquid droplet attached to the plurality of first protruding pins,
    wherein the liquid droplet is not attached to the one or more second protruding pins,
    wherein the plurality of first protruding pins arranged to be spaced apart from each other in a first direction and a second direction intersecting the first direction in a matrix form in each pickup region of the head body, and
    wherein the one or more second protruding pins have a same height as each of the plurality of first protruding pins.

12. The microchip transfer apparatus of claim 11, wherein the plurality of first protruding pins and a portion of the head body in the plurality of pickup regions are hydrophilized, and a portion of the head body in the plurality of dummy regions is hydrophobized by coating the fluoropolymer on the one or more second protruding pins.

13. A microchip transfer method comprising:
    (a) aligning a transportation head having and a liquid droplet attached thereto with a top of a chip support accommodating a microchip thereon;
    (b) contacting the liquid droplet attached to the transportation head with the microchip mounted on the chip support and picking up the microchip from the chip support; and
    (c) attaching the microchip picked up using the liquid droplet of the transportation head to a substrate and transferring the microchip thereto,
    wherein the transportation head includes:
    a head body having a plurality of pickup regions and a plurality of dummy regions being non-pickup regions and each pickup region disposed between two dummy regions;

a plurality of first protruding pins disposed in each pickup region of the head body;
one or more second protruding pins disposed in each dummy region of the head body; and
a liquid droplet attached to the plurality of first protruding pins,
wherein the liquid droplet is not attached to the one or more second protruding pins,
wherein the plurality of first protruding pins arranged to be spaced apart from each other in a first direction and a second direction intersecting the first direction in a matrix form in each pickup region of the head body, and
wherein the one or more second protruding pins have a same height as each of the plurality of first protruding pins.

14. The method of claim 13, wherein the plurality of first protruding pins and a portion of the head body in the plurality of pickup regions are hydrophilized, and a portion of the head body in the plurality of dummy regions is hydrophobized by coating the fluoropolymer on the one or more second protruding pins.

15. The method of claim 13, wherein the (a) to (c) are repeated at least one time, and
wherein the microchip transfer method further replenishes the liquid droplet when an amount of the liquid droplet decreases while repeating the (a) to (c).

16. The method of claim 15, wherein replenishing the liquid droplet includes a dipping scheme or a vapor evaporation condensation scheme.

* * * * *